(12) United States Patent
Abraham et al.

(10) Patent No.: US 10,108,684 B2
(45) Date of Patent: Oct. 23, 2018

(54) DATA SIGNAL MIRRORING

(75) Inventors: Michael M. Abraham, Meridian, ID (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 794 days.

(21) Appl. No.: 13/046,420

(22) Filed: Mar. 11, 2011

(65) Prior Publication Data

US 2012/0109896 A1     May 3, 2012

Related U.S. Application Data (60) Provisional application No. 61/409,369, filed on Nov. 2, 2010.

(51) Int. Cl.
| | |
|---|---|
| *G06F 12/16* | (2006.01) |
| *G06F 17/30* | (2006.01) |
| *G06F 13/16* | (2006.01) |
| *G11C 7/10* | (2006.01) |

(52) U.S. Cl.
CPC ........ *G06F 17/30575* (2013.01); *G06F 12/16* (2013.01); *G06F 13/1694* (2013.01); *G11C 7/1006* (2013.01)

(58) Field of Classification Search
CPC ...................................... G06F 12/16
USPC ...................................... 711/154
See application file for complete search history.

(56) References Cited

U.S. PATENT DOCUMENTS

| | | | |
|---|---|---|---|
| 5,056,015 A | 10/1991 | Baldwin et al. | |
| 6,834,322 B2 | 12/2004 | Sukegawa | |
| 7,181,584 B2 * | 2/2007 | LaBerge | G11C 5/00 711/167 |
| 7,269,082 B2 | 9/2007 | Naito | |
| 7,755,947 B2 | 7/2010 | Fujita et al. | |
| 7,778,057 B2 | 8/2010 | McCarthy et al. | |
| 7,831,742 B2 | 11/2010 | Bernardi | |
| 7,864,622 B2 | 1/2011 | Sohn et al. | |
| 8,504,801 B2 | 8/2013 | Sakamaki et al. | |
| 2004/0076030 A1 | 4/2004 | Martin et al. | |
| 2004/0090827 A1 | 5/2004 | Dahlen et al. | |
| 2005/0262318 A1 * | 11/2005 | Chae et al. | 711/162 |
| 2006/0095817 A1 * | 5/2006 | Lee | G11C 5/04 714/719 |

(Continued)

FOREIGN PATENT DOCUMENTS

| | | |
|---|---|---|
| CN | 1516021 | 7/2004 |
| JP | 63-245717 A | 10/1988 |

(Continued)

OTHER PUBLICATIONS

International Search Report and Written Opinion for related PCT Application No. PCT/US2011/001800 dated Feb. 29, 2012 (9 pp.).

(Continued)

*Primary Examiner* — Gautam Sain
(74) *Attorney, Agent, or Firm* — Brooks, Cameron & Huebsch, PLLC (57) ABSTRACT

Methods, devices, and systems for data signal mirroring are described. One or more methods include receiving a particular data pattern on a number of data inputs/outputs of a memory component, and responsive to determining that a mirrored version of the particular data pattern is received by the memory component, configuring the number of data inputs/outputs to be mirrored.

19 Claims, 8 Drawing Sheets

(56) References Cited

U.S. PATENT DOCUMENTS

| | | |
|---|---|---|
| 2006/0187739 A1 | 8/2006 | Borkenhagen et al. |
| 2006/0224849 A1* | 10/2006 | Rezaul Islam et al. ...... 711/170 |
| 2006/0277399 A1 | 12/2006 | Sakamaki et al. |
| 2007/0001299 A1* | 1/2007 | Kikuchi .............. H01L 23/5383 257/723 |
| 2007/0008787 A1 | 1/2007 | Oh et al. |
| 2007/0018861 A1* | 1/2007 | Fitzgibbon et al. ............ 341/51 |
| 2008/0112224 A1 | 5/2008 | Lee et al. |
| 2008/0159027 A1* | 7/2008 | Kim .............................. 365/198 |
| 2008/0209110 A1* | 8/2008 | Pyeon et al. ................. 711/103 |
| 2008/0320214 A1 | 12/2008 | Ma et al. |
| 2009/0100222 A1* | 4/2009 | Laker ........................... 711/114 |
| 2009/0300271 A1* | 12/2009 | Yang ....................... G06F 12/06 711/103 |
| 2010/0082884 A1 | 4/2010 | Chen et al. |
| 2010/0115217 A1 | 5/2010 | Oh et al. |
| 2010/0174851 A1 | 7/2010 | Leibowitz et al. |
| 2010/0246280 A1 | 9/2010 | Kanda |
| 2010/0259980 A1 | 10/2010 | Futatsuyama |

FOREIGN PATENT DOCUMENTS

| | | |
|---|---|---|
| JP | 05-334179 A | 12/1993 |
| JP | 2006-338231 A | 12/2006 |
| KR | 20060125542 | 12/2006 |
| TW | 200612438 | 4/2006 |
| TW | 200703357 | 1/2007 |

OTHER PUBLICATIONS

Grunzke, ONFI 3.0 The Path to 400MT/s NAND Interface Speeds, Flash Memory Summit, Santa Clara, California, http://www.flashmemorysummit.com/English/Collaterals/Proceesings/2010/20100818_S104_Grunzke.pdf, accessed from web-site Jan. 20, 2010 (17 pgs.).

Grunzke, Line Termination Methods and Apparatus, filed Aug. 13, 2010 as U.S. Appl. No. 12/856,000 (32 pgs.).

Feeley, et al., Copyback Operations, filed Mar. 11, 2011 as U.S. Appl. No. 13/046,427 (23 pgs.).

Butterfield, Systems, Devices, Memory Controllers, and Methods for Controlling Memory, filed Mar. 11, 2011 as U.S. Appl. No. 13/046,439 (27 pgs.).

Grunzke, Systems, Devices, Memory Controllers, and Methods for Memory Initialization, filed Mar. 11, 2011 as U.S. Appl. No. 13/046,446 (27 pgs.).

ONFI Workgroup, Open NAND Flash Interface Specification revision 3.0, ONFI Workgroup, Published Mar. 15, 2011 (288 pgs.).

Nobunaga, Method and Apparatus for Addressing Memory Arrays, filed Mar. 11, 2011 as U.S. Appl. No. 13/046,248 (29 pgs.).

Office Action for related Taiwan Patent Application No. 100140013, dated Apr. 22, 3014, 21 pages.

Notice of Rejection for related Korean Patent Application No. 10-2013-7013870, dated Aug. 19, 2014, 9 pages.

Decision of Rejection for related Taiwan Patent Application No. 100140013, dated Aug. 15, 2014, 5 pages.

Office Action for related China Patent Application No. 20110056213.0, dated Oct. 30, 2014, 23 pages.

Office Action for related China Patent Application No. 201180056213.0, dated Jun. 3, 2015, 21 pages.

Notice of Preliminary Rejection for related Korea Patent Application No. 10-2013-7013870, dated Oct. 30, 2015, 9 pages.

Office Action for related China Patent Application No. 201180056213.0, dated Nov. 13, 2015, 9 pages.

Search Report from related European patent application No. 118938342.1, dated Apr. 11, 2014, 6 pp.

Notice of Rejection Grounds from related Japanese Patent Application No. 2010-536601, dated Feb. 25, 2014, 6 pp.

Notice of Preliminary Rejection for related Korea Patent Application No. 10-2013-7013870, dated Feb. 27, 2015, 7 pages.

Office Action for related Taiwan Patent Application No. 100140013, dated Feb. 7, 2017, 7 pages.

* cited by examiner

DATA SIGNAL MIRRORING

PRIORITY INFORMATION

This application is a Non-Provisional Application of U.S. Provisional Application No. 61/409,369, filed Nov. 2, 2010, the entire specification of which is herein incorporated by reference.

TECHNICAL FIELD

The present disclosure relates generally to semiconductor memory devices, methods, and systems, and more particularly, to methods, devices, and systems for data signal mirroring.

BACKGROUND

Memory devices are typically provided as internal, semiconductor, integrated circuits in computers or other electronic devices. There are many different types of memory including volatile and non-volatile memory. Volatile memory can require power to maintain its information and includes random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a solid state drive (SSD). A solid state drive can include non-volatile memory (e.g., NAND flash memory and NOR flash memory), and/or can include volatile memory (e.g., DRAM and SRAM), among various other types of non-volatile and volatile memory. An SSD can be used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can include one or more discrete memory packages, and one or more of the memory packages can be multi-chip packages (MCPs). A MCP can include a number of memory dies or chips therein. As used herein, "a number of" something can refer to one or more of such things. As an example, the memory chips and/or dies associated with a MCP can include a number of memory arrays along with peripheral circuitry. The memory arrays can include memory cells organized into a number of physical blocks. Also, the chips/dies of a MCP can be referred to as logical units (LUNs).

Reduction of the size and power consumption associated with memory systems and memory system components is desirable. It is also desirable to maintain signal integrity within memory systems as the size of memory systems and components changes.

DETAILED DESCRIPTION

The present disclosure includes methods, devices, and systems for data signal mirroring. One or more methods include receiving a particular data pattern on a number of data inputs/outputs of a memory component (e.g., via a data bus), and in response to determining that a mirrored version of the particular data pattern is received by the memory component, configuring the number of data inputs/outputs to be mirrored.

Embodiments of the present disclosure can provide various benefits such as maintaining and/or improving signal integrity within memory devices, as well as improved routing between memory devices coupled to the same printed circuit board (PCB), as compared to prior approaches. Embodiments can also provide benefits such as increasing memory capacity of memory systems and/or reducing pin counts associated with memory system controllers as compared to prior systems.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," and "M," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar components between different figures may be identified by the use of similar digits. For example, 104 may reference component "04" in FIG. 1, and a similar component may be referenced as 204 in FIG. 2. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

Figure 1:
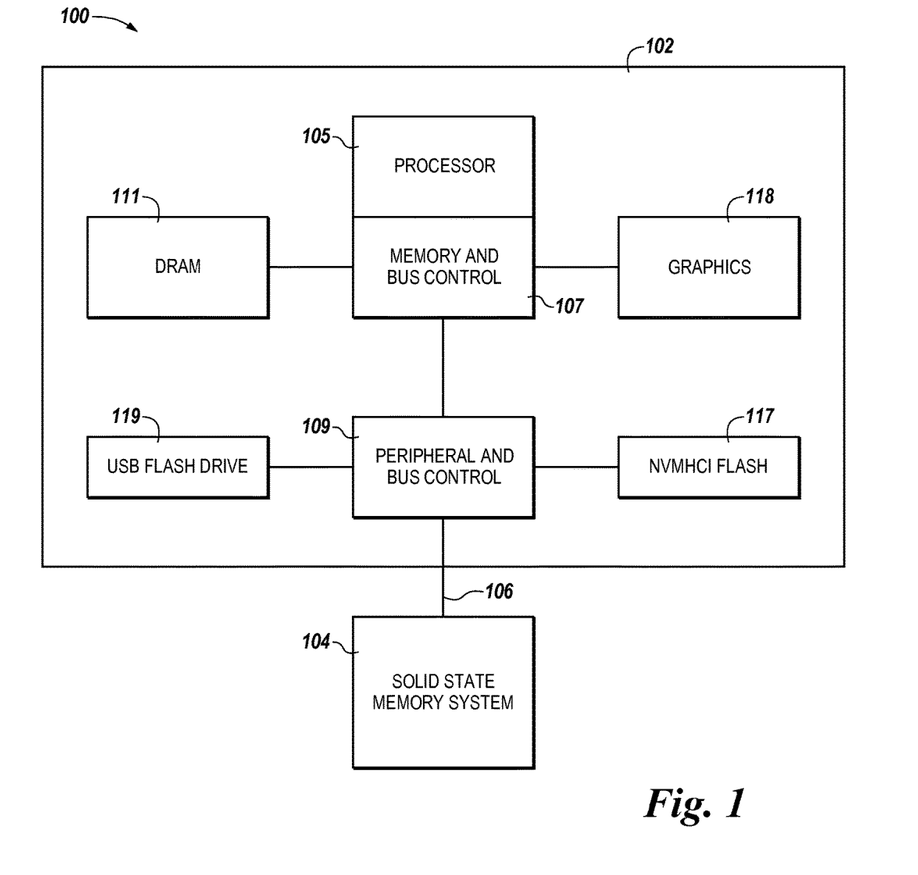
FIG. 1 is a block diagram of a computing system in accordance with one or more embodiments of the present disclosure.

FIG. 1 is a functional block diagram of a computing system in accordance with one or more embodiments of the present disclosure. Computing system 100 includes a memory system 104, for example one or more solid state drives (SSDs), communicatively coupled to host 102. Memory system 104 can be communicatively coupled to the host 102 through an interface 106, such as a backplane or bus, for instance.

Examples hosts 102 can include laptop computers, personal computers, digital cameras, digital recording and playback devices, mobile telephones, PDAs, memory card readers, and interface hubs, among other host systems. The interface 106 can include a serial advanced technology attachment (SATA), peripheral component interconnect express (PCIe), or a universal serial bus (USB), among other connectors and interfaces. In general, however, host interface 106 can provide an interface for passing control, address, data, and other signals between the memory system 104 and the host 102.

Host 102 can include one or more processors 105 (e.g., parallel processors, co-processors, etc.) communicatively coupled to a memory and bus control 107. The processor 105 can be one or more microprocessors, or some other type of controlling circuitry, such as one or more application-specific integrated circuits (ASICs), for example. Other components of the computing system 100 may also have processors. The memory and bus control 107 can have memory and other components directly communicatively coupled thereto, for example, dynamic random access memory (DRAM) 111, graphic user interface 118, or other user interface (e.g., display monitor, keyboard, mouse, etc.).

The memory and bus control 107 can also have a peripheral and bus control 109 communicatively coupled thereto, which in turn, can connect to a memory system, such as a flash drive 119 using a universal serial bus (USB) interface, a non-volatile memory host control interface (NVMHCI) flash memory 117, or the memory system 104. As the reader will appreciate, the memory system 104 can be used in addition to, or in lieu of, a hard disk drive (HDD) in a number of different computing systems. The computing system 100 illustrated in FIG. 1 is one example of such a system; however, embodiments of the present disclosure are not limited to the configuration shown in FIG. 1. Enterprise solid state storage appliances are a class of memory systems that can currently be characterized by terabytes of storage and fast performance capabilities, for example 100 MB/sec, 100K inputs/outputs per second (IOPS), etc. According to one or more embodiments of the present disclosure, an enterprise solid state storage appliance can be configured using solid state drive (SSD) components. For example, with respect to FIG. 1, the memory system 104 may be an enterprise solid state storage appliance implemented using one or more component SSDs, the one or more SSDs being operated as a memory system by a memory system controller.

Figure 2:
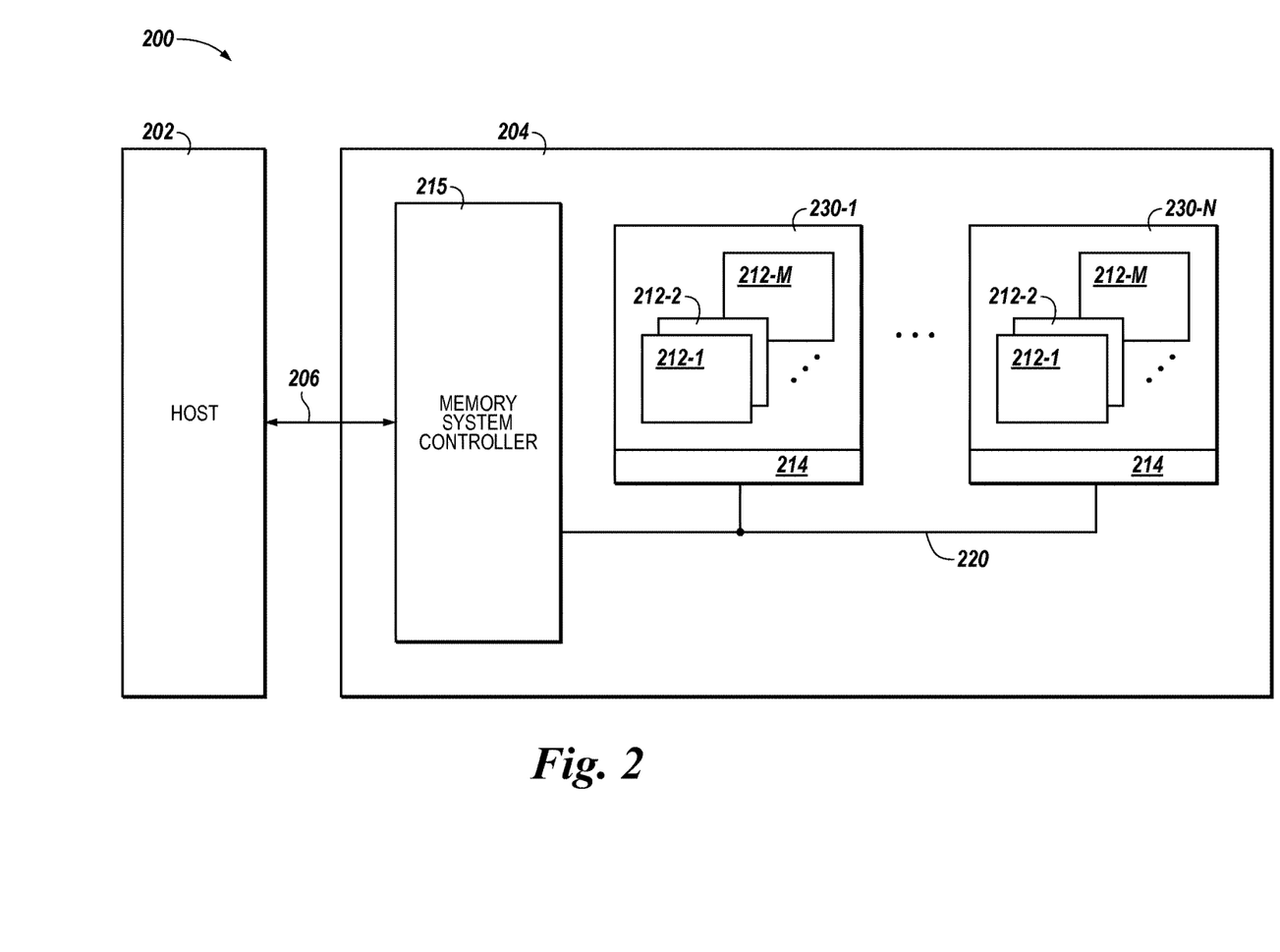
FIG. 2 is a block diagram of a computing system including at least one memory system in accordance with one or more embodiments of the present disclosure.

FIG. 2 is a block diagram of a computing system 200 including at least one memory system 204 in accordance with one or more embodiments of the present disclosure. As one example, the memory system 204 can be a solid state drive (SSD). The memory system 204 can be coupled to a host 202 via a host interface 206 and can include a memory system controller 215 (e.g., memory control circuitry, firmware, and/or software), and one or more memory devices 230-1, . . . , 230-N coupled to the system controller 215. In one or more embodiments, the memory controller 215 can be an application specific integrated circuit (ASIC) coupled to a printed circuit board.

The memory system 204 includes a bus 220 to send/receive various signals (e.g., data signals, control signals, and/or address signals), between the memory devices 230-1, . . . , 230-N and the system controller 215. Although the example illustrated in FIG. 2 includes a single bus 220, the memory system 204 can include a separate data bus (DQ bus), control bus, and address bus, in some embodiments. The bus 220 can have various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PC-MCIA), Firewire (IEEE 1394), and Small Computer Systems Interface (SCSI).

As illustrated in FIG. 2, the memory devices 230-1, . . . , 230-N can include a number of memory units 212-1, 212-2, . . . , 212-M that provide a storage volume for the memory system 204. The memory units 212-1, 212-2, . . . , 212-M can be dies or chips, which can be referred to as logical units (LUNs). As such, the memory devices 230-1, . . . , 230-N can be multi-chip packages (MCPs) that include a number of dies 212-1, 212-2, . . . , 212-M, in various embodiments. As an example, and as illustrated in FIGS. 3A-3E, the MCPs 230-1, . . . , 230-N can be coupled to either side (e.g., top or bottom) of a printed circuit board (PCB), for instance.

The memory units 212-1, 212-2, . . . , 212-M can include one or more arrays of memory cells. In one or more embodiments, the memory units 212-1, 212-2, . . . , 212-M include flash arrays having a NAND architecture; however, embodiments are not limited to a particular type of memory array or array architecture.

In various embodiments, and as illustrated in FIG. 2, the memory devices 230-1, . . . , 230-N include circuitry 214 configured to receive and process signals (e.g., control and/or data signals) from the system controller 215 via the bus 220. Although not shown in FIG. 2, the memory devices 230-1, . . . , 230-N can include data inputs/outputs (e.g., DQ pins) for receiving signals via the bus 220. As described further below in connection with FIG. 3, a data bus (e.g., DQ bus) can be externally routed between the memory devices 230-1, . . . , 230-N (e.g., MCPs). The DQ bus can be routed such that corresponding DQ pins of the memory devices 230-1, . . . , 230-N are coupled together. For instance, assuming the memory devices 230-1, . . . , 230-N each have 8 DQ pins (numbered DQ0-DQ7), then the DQ0 pins of the memory devices 230-1, . . . , 230-N would be coupled together, the DQ1 pins would be coupled together, the DQ2 pins would be coupled together, etc. However, when memory devices 230-1, . . . , 230-N are located on the top side and bottom side of a PCB, for example, then the DQ pins are flipped with respect to each other such that descrambling of signals routed through the PCB is required in order to match equivalently numbered DQ pins, which typically increases the complexity of the signal routing on the PCB. As a result, a data pattern corresponding to data signals received by a memory device on a top side of a PCB will be received in a non-mirrored manner by a memory device on a bottom side of the PCB. For instance, if data signals corresponding to a binary data pattern 11100000 is received by a memory device on the top side of a PCB, then the same binary data pattern is received as 1110000 by a memory device on the bottom side of a PCB. However, it is possible to reduce the complexity of the signal routing of a PCB by not descrambling the signals on the PCB, but by connecting them backwards, in a mirrored manner. As a result, a data pattern corresponding to data signals received by a memory device on a top side of a PCB and received by its DQ pins will be will be received in a mirrored manner by a memory device on a bottom side of the PCB. For instance, if data signals corresponding to a binary data pattern 11100000 is received by a memory device on the top side of a PCB, then the same binary data pattern is received as 00000111 by a memory device on the bottom side of the PCB. As such, the memory device on the bottom side may be referred to as a "mirrored" device. In some previous approaches, the memory devices 230-1, . . . , 230-N could include an extra input/output pin, which could be set Hi/Lo to indicate whether the particular memory device was mirrored or not. As such, the status of the extra input/output pin could be polled to determine whether a device was mirrored or not.

In one or more embodiments of the present disclosure, the circuitry 214 of the memory devices 230-1, . . . , 230-N can include a mirroring component. The mirroring component 214 can be configured to electronically mirror data signals subsequently received by a memory device 230-1, . . . , 230-N responsive to a determination that a particular data pattern received by the number of data inputs/outputs (e.g., DQ pins) is a mirrored version of a particular data pattern sent to the memory device. For example, if the memory device 230-1, . . . , 230-N is expecting the binary data pattern 01111000 and it receives the binary data pattern 00011110, then the mirroring component 214 can determine that the bus 220 is mirrored and can electronically mirror subsequent data received on the bus 220 to make it appear unmirrored to subsequent components (e.g., circuits, logic, etc.). In one or more embodiments, the particular data pattern can correspond to a mirrorable initialization command provided from the memory system controller 215. For example, upon initialization, for instance, a memory device 230-1, . . . , 230-N would be expecting a particular data pattern corresponding to the initialization command. If the data pattern received by the memory device is a mirrored version of the data pattern corresponding to the expected initialization command, then the mirroring component would determine that the bus is mirrored such that subsequent data received to the device on the bus would be mirrored and would appear unmirrored to subsequent components. In one or more embodiments, the particular data pattern can correspond to a reset command or a first command received subsequent to a reset command provided from the memory system controller 215. In one or more embodiments, the particular data pattern can correspond to a configuration command (e.g., a read status command) sent from the memory system controller 215.

As an example, assume that data signals corresponding to a data pattern of 11100000 are provided to the memory devices 230-1, . . . , 230-N via bus 220 (e.g., from system controller 215). The mirroring component 214 of the unmirrored devices will determine that the received data pattern is unmirrored since the data pattern is identical to what the memory device expects to receive (e.g., data inputs/outputs DQ0-DQ7 correspond to the appropriate bits of the data pattern). However, the mirroring component 214 of mirrored devices will receive a mirrored version of the data pattern 11100000 (e.g., the mirrored devices will receive 00000111). Based on the determination by the mirroring component 214 that the received data pattern is a mirrored version of the data pattern provided to the memory device, the mirroring component 214 can electronically mirror subsequent data signals received by the mirrored memory device. For example, once the mirroring component 214 determines that the received data pattern is a mirrored version, subsequently received data signals can automatically be mirrored by component 214. As such, the mirroring component 214 of the memory devices 230-1, . . . , 230-N can configure the data inputs/outputs of the devices to be mirrored or unmirrored in response to received data signals.

In one or more embodiments, the circuitry 214 of the memory devices 230-1, . . . , 230-N can include circuitry in addition to a mirroring component. As an example, circuitry 214 can include control circuitry for performing operations such as data read, write, and erase operations on the memory units 212-1, 212-2, . . . , 212-M of memory devices 230-1, . . . , 230-N.

FIGS. 3A-3E illustrate electrically connected memory components in accordance with one or more embodiments of the present disclosure. The memory components can be, for example, memory devices such as memory devices 230-1, . . . , 230-N and/or memory controllers such as system controller 215 described in FIG. 2. However, embodiments are not limited to a particular type of memory component. Although only a data bus (e.g., DQ bus) is shown in FIGS. 3A-3E, one of ordinary skill in the art will appreciate that other signals can be connected between the memory components illustrated.

Figure 3A:
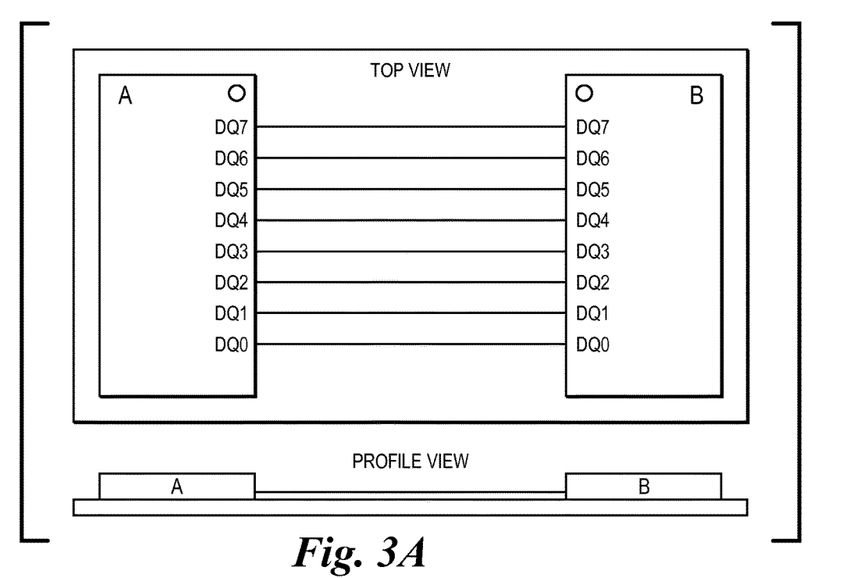
FIGS. 3A-3E illustrate electrically connected memory components in accordance with one or more embodiments of the present disclosure.

FIG. 3A illustrates two electrically connected memory components, A and B. In this example, both memory components are placed on the top side of a PCB. A DQ bus is externally routed between components A and B. The connections between memory components A and B are illustrated as straight since the equivalently named DQ signals on the DQ bus are aligned (e.g., DQ1 of component A is aligned with DQ 1 of component B, etc.). As such, the routing between DQ inputs/outputs is simple and descrambling of the signals through the PCB is not required.

Figure 3B:
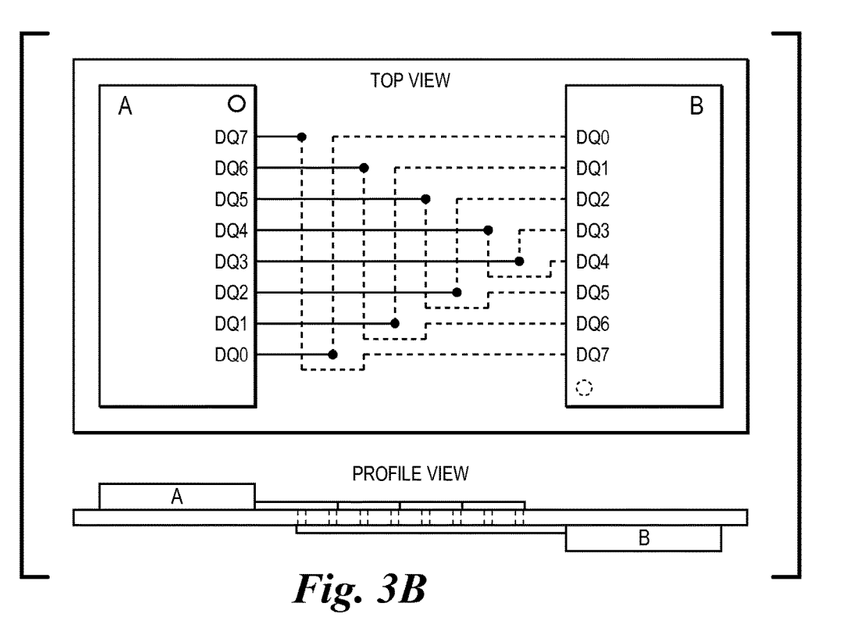

FIG. 3B illustrates two electrically connected memory components, A and B. In this example, memory component A is placed on the top side of a PCB and memory component B is placed on the bottom side of the PCB. A DQ bus is externally routed between components A and B. Since memory component B is on an opposite side of the PCB as memory component A, the data signals corresponding to memory component B are flipped in order to connect the equivalently named DQ signals corresponding to components A and B. Vias in the PCB are used to provide routing from the top to the bottom of the PCB in order to connect the equivalently numbered DQ inputs/outputs of components A and B. As such, the routing between DQ inputs/outputs is more complicated than that illustrated in FIG. 3A, for example, which can require descrambling on the PCB.

Figure 3C:
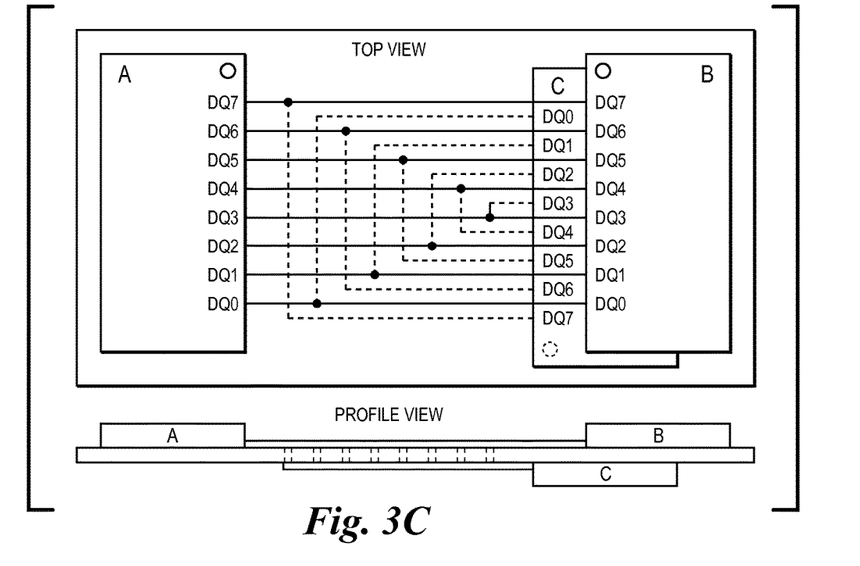

FIG. 3C illustrates three electrically connected memory components, A, B, and C. In this example, memory components A and B are placed on the top side of a PCB and memory component C is placed on the bottom side of the PCB. Memory components B and C both include a DQ bus externally routed opposite memory component A. The connections between memory components A and B are illustrated as straight since the equivalently named DQ signals on the DQ bus are aligned (e.g., DQ1 of component A is aligned with DQ1 of component B, etc.). However, since memory component C is on an opposite side of the PCB as memory component A (and B), the data signals corresponding to memory component C are flipped in order to connect the equivalently named DQ signals corresponding to components A, B, and C. As such, the signals on the top side of the PCB do not require descrambling, but the signals on the bottom side require descrambling.

Figure 3D:
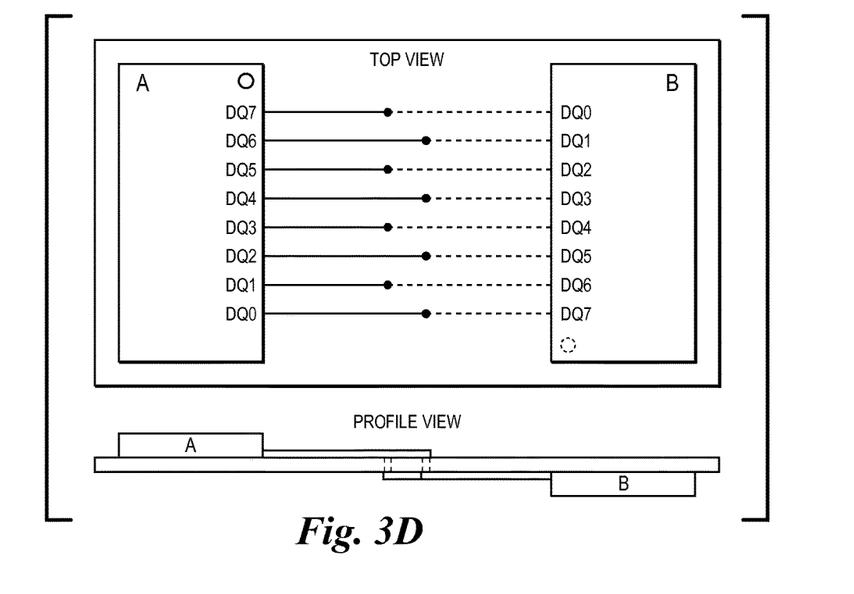

FIG. 3D illustrates two electrically connected memory components, A and B. In this example, memory component A is placed on the top side of a PCB and memory component B is placed on the bottom side of the PCB. A DQ bus is externally routed between components A and B. Although not shown in FIG. 3D, the memory component B includes a mirroring component (e.g., such as component 214 shown in FIG. 2). As such, when data signals are provided to memory component B across the DQ bus, the mirroring component of component B can determine (e.g., identify) that the signals are mirrored and can configure its data inputs/outputs such that DQ7 is DQ0, DQ6 is DQ1, DQ5 is DQ2, DQ4 is DQ3, DQ3 is DQ4, DQ2 is DQ5, DQ1 is DQ6, and DQ0 is DQ7. As such, the electrical routing between components A and B does not need to be descrambled (e.g., the connections between memory components A and B are illustrated as straight). Without a mirroring component in accordance with embodiments described herein, the routing between memory components A and B would be similar to that shown in FIG. 3B. Therefore, the physical routing between memory components A and B illustrated in FIG. 3D is simplified as compared to the physical routing illustrated in FIG. 3B, for instance.

Figure 3E:
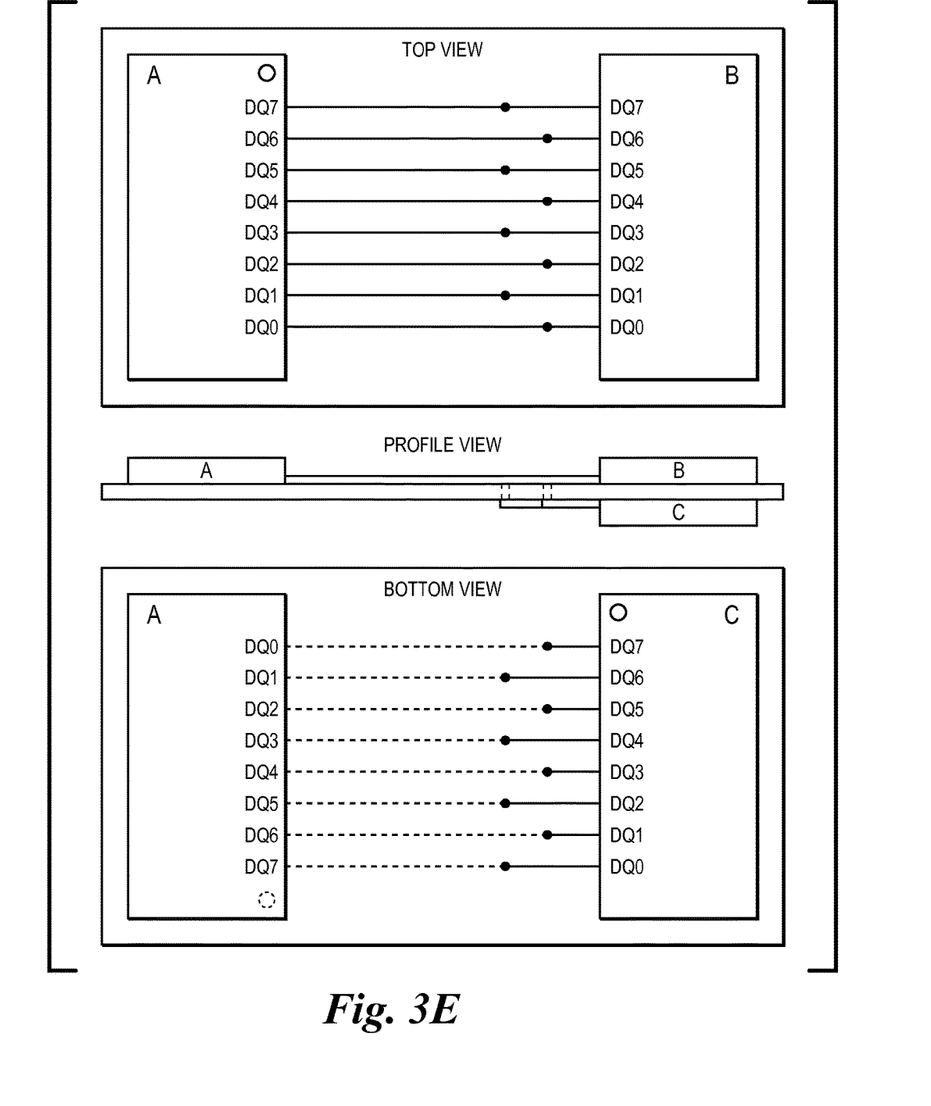

FIG. 3E illustrates three electrically connected memory components, A, B, and C. In this example, memory components A and B are placed on the top side of a PCB and memory component C is placed on the bottom side of the PCB. Memory components B and C both include a DQ bus externally routed opposite memory component A. Although not shown in FIG. 3E, both components B and C can include a mirroring component (e.g., such as component 214 shown in FIG. 2). As an example, when data signals are provided to memory component C across the DQ bus, the mirroring component of component C can determine that the signals are mirrored and can configure its data inputs/outputs such that DQ7 is DQ0, DQ6 is DQ1, DQ5 is DQ2, DQ4 is DQ3, DQ3 is DQ4, DQ2 is DQ5, DQ1 is DQ6, and DQ0 is DQ7 (e.g., the mirroring function of memory component C can be activated responsive to receiving a mirrored version of a data pattern). In contrast, when the same data signals are provided to memory component B across the DQ bus, the mirroring component in device B receives the data signals as unmirrored; therefore, the mirroring function of memory component B is not activated since the electrical routing between A and B does not need to be descrambled. Without a mirroring component in accordance with embodiments described herein, the routing between memory components A and C would be similar to that shown in FIG. 3C. Therefore, the physical routing between memory components A and C illustrated in FIG. 3E is simplified as compared to the physical routing illustrated in FIG. 3C, for instance.

Figure 4:
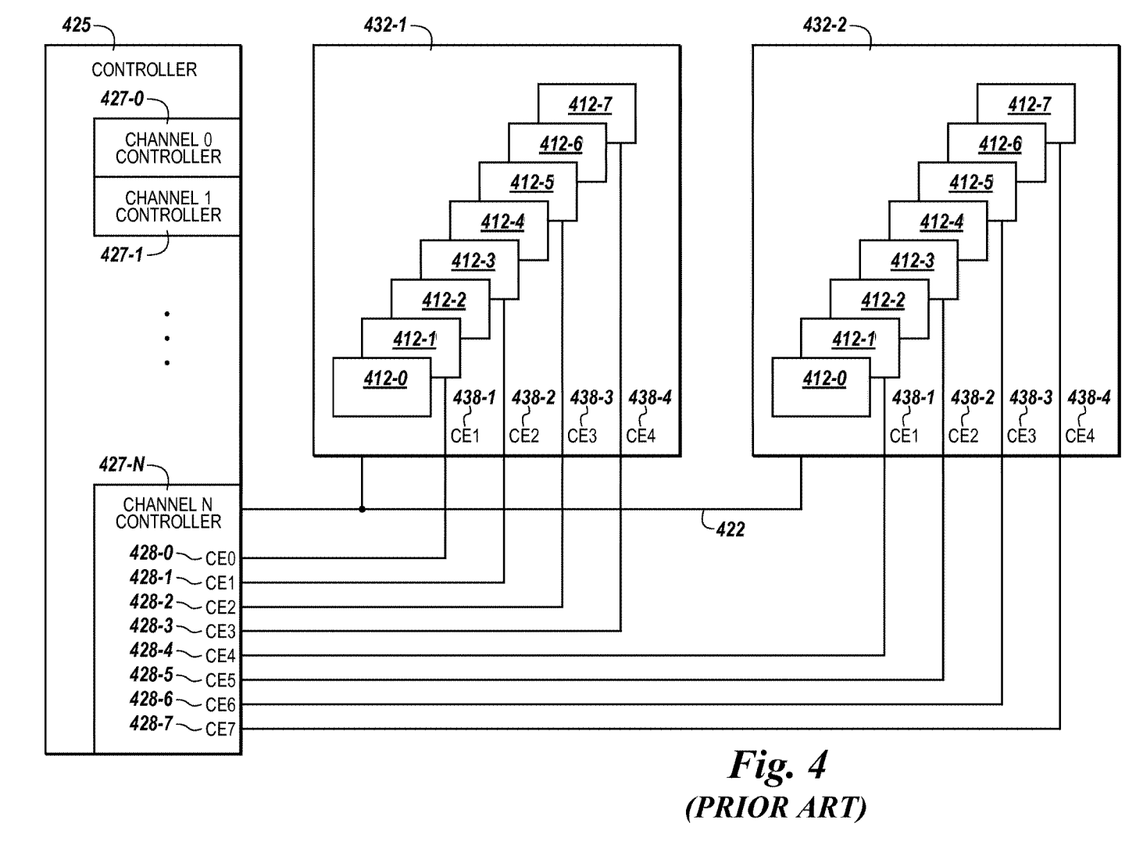
FIG. 4 is a block diagram of a portion of a memory system in accordance with prior art.

FIG. 4 is a block diagram of a portion of a memory system in accordance with prior art. The memory system illustrated in FIG. 4 includes a system controller 425. The system controller 425 can control access across a number of memory channels. In this example, the controller 425 includes a number of channel controllers 427-0, 427-1, ..., 427-N each controlling access to a respective memory channel.

In the example shown in FIG. 4, the channel controller 427-N is coupled to a first memory device 432-1 and a second memory device 432-2 via a bus 422 (e.g., a data and control bus). Each of the memory devices 432-1 and 432-2 includes 8 memory units 412-0 to 412-7. The memory units 412-0 to 421-7 can be memory die and the memory devices 432-1 and 432-2 can be multi-chip packages, as an example. In this example, each of the memory devices 432-1 and 432-2 include four chip enable (CE) pins 438-1 (CE1), 438-2 (CE2), 438-3 (CE3), and 438-4 (CE4) that receive CE signals from the channel controller 427-N. As such, the system controller 425 includes eight CE pins dedicated to providing the CE signals to the memory devices 432-1 and 432-2. Although not shown in FIG. 4, each of the channel controllers 427-0 to 427-N can be coupled to a number of memory devices (e.g., two in this example). As such, if the system controller 425 includes 32 channels with each channel corresponding to two memory devices, then the total number of CE pins would be 256.

Figure 5:
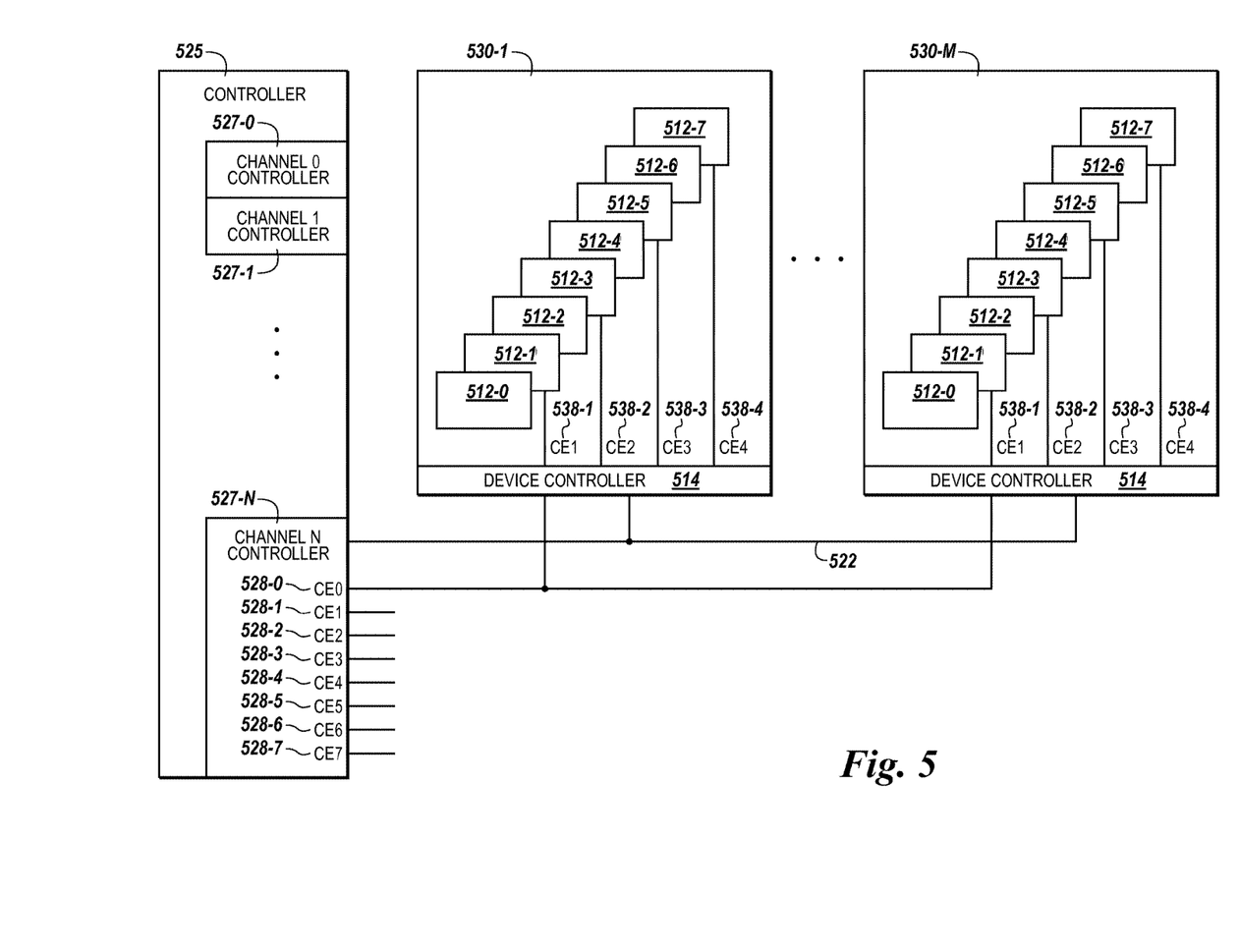
FIG. 5 is a block diagram of a portion of a memory system in accordance with one or more embodiments of the present disclosure.

FIG. 5 is a block diagram of a portion of a memory system in accordance with one or more embodiments of the present disclosure. The embodiment illustrated in FIG. 5 can provide reduced pin counts as compared to previous memory systems such as that described above in connection with FIG. 4. The memory system illustrated in FIG. 5 includes a system controller 525. The system controller 525 can control access across a number of memory channels. In this example, the controller 525 includes a number of channel controllers 527-0, 527-1, ..., 527-N each controlling access to a respective memory channel.

In the example shown in FIG. 5, the channel controller 527-N is coupled to a number of memory devices 530-1, ..., 530-M via a bus 522 (e.g., a data and control bus). In this embodiment, each of the memory devices 530-1, ..., 530-M includes 8 memory units (e.g., die) 512-0 to 512-7. The memory devices 530-1, ..., 530-M can be multi-chip packages, as an example. In the system illustrated in FIG. 5, the memory devices 530-1, ..., 530-M each include a device controller 514. The device controller 514 can perform various operations on the memory units 512-0 to 512-7 of the memory devices 530-1, ..., 530-M in response to signals from the system controller 525.

In this example, each of the memory devices 530-1, ..., 530-M include four chip enable (CE) pins 538-1 (CE1), 538-2 (CE2), 538-3 (CE3), and 538-4 (CE4) that receive CE signals from the channel controller 527-N. However, unlike in the example illustrated in FIG. 4, a CE signal from a single pine (e.g., 528-0) of the system controller 525 is shared by the number of memory devices 530-1, ..., 530-M corresponding to the particular memory channel (e.g., channel N). As such, the remaining CE pins (e.g., 528-1 to 528-7) associated with channel controller 527-N can be used for other purposes or eliminated in order to reduce the total pin count associated with the system controller 525. For instance, as compared to the example illustrated in FIG. 4, the system controller 525 would include 32 CE pins (e.g., one CE pin for each of 32 channels) instead of 256 CE pins (e.g., eight for each of 32 channels).

Figure 6:
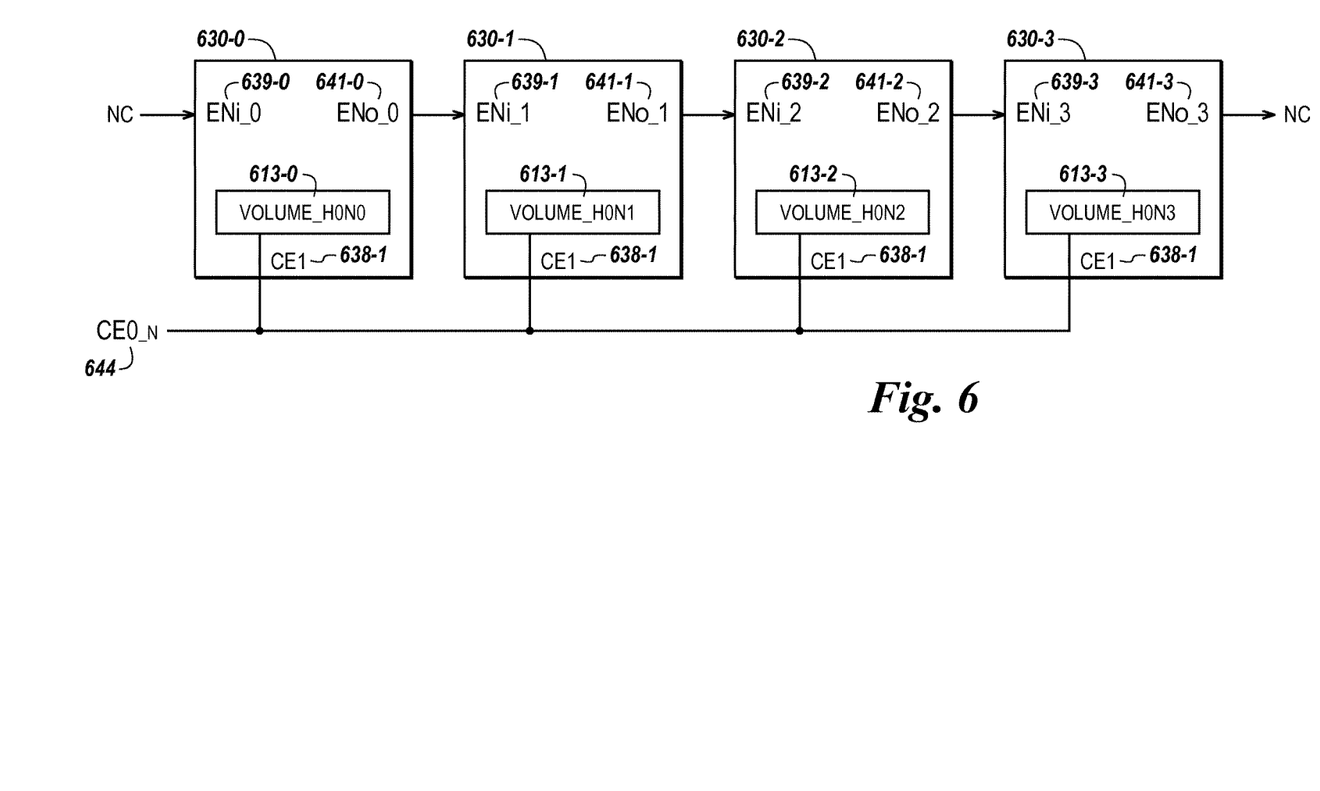
FIG. 6 is a block diagram of a portion of a memory system in accordance with one or more embodiments of the present disclosure.

FIG. 6 is a block diagram of a portion of a memory system in accordance with one or more embodiments of the present disclosure. The embodiment illustrated in FIG. 6 includes a number of memory devices 630-0, 630-1, 630-2, and 630-3 and illustrates an example topology for pin reduction in accordance with one or more embodiments of the present disclosure. The memory devices 630-0, 630-1, 630-2, and 630-3 can be memory devices such as devices 530-1 to 530-M shown in FIG. 5. As an example, the memory devices 630-0, 630-1, 630-2, and 630-3 can be NAND memory devices.

In the example illustrated in FIG. 6, each of the devices 630-0, 630-1, 630-2, and 630-3 includes an enable input pin 639 and an enable output pin 641. For instance, device 630-0 includes enable input pin 639-0 (ENi_0) and enable output pin 641-0 (ENo_0), device 630-1 includes enable input pin 639-1 (ENi_1) and enable output pin 641-1 (ENo_1), device 630-2 includes enable input pin 639-2 (ENi_2) and enable output pin 641-2 (ENo_2), and device 630-3 includes enable input pin 639-3 (ENi_3) and enable output pin 641-3 (ENo_3).

As illustrated, a daisy chain configuration can be created between the memory devices 630-0, 630-1, 630-2, and 630-3. In this example, the enable input pin 639-0 of device 630-0 and the enable output pin 641-3 of device 630-3 are not connected (NC). The enable input pins 639 of the other devices are connected to the enable output pin 641 of the previous device in a daisy chain configuration as shown in FIG. 6.

As illustrated in FIG. 6, and as described above in connection with FIG. 5, each of the memory devices 630-0, 630-1, 630-2, and 630-3 share a common CE pin from a system controller (e.g., system controller 525 shown in FIG. 5). For instance, chip enable pin 644 (CE0_n) is shared by the chip enable pin 638-1 (CE1) of each of the memory devices 630-0, 630-1, 630-2, and 630-3. The CE1 pin of each of the memory devices 630-0, 630-1, 630-2, and 630-3 corresponds to a particular target volume 613-0, 613-1, 613-2, 613-3. A target volume can refer to a number of memory units (e.g., die or LUNs) that share a particular CE signal within a memory device. Each of the target volumes can be assigned a volume address. In this example, target volume 613-0 is assigned volume address H0N0, target volume 613-1 is assigned volume address H0N1, target volume 613-2 is assigned volume address H0N2, and target volume 613-3 is assigned volume address H0N3. In one or more embodiments, the volume addresses can be assigned to particular target volumes upon initialization of the memory system.

In operation, the state of the enable input pins 639-0, 639-1, 639-2, and 639-3 determines whether the respective memory device 630-0, 630-1, 630-2, and 630-3 is able to accept commands. For example, if the enable input pin of a particular device is high and the CE pin 638-1 of the device is low, then the particular device can accept commands. If the enable input of the particular device is low or the CE pin 638-1 is high, then the device cannot accept commands. A volume select command can be issued by the system controller in order to select a particular target volume (e.g., 613-0, 613-1, 613-2, 613-3) coupled to a particular CE pin 644 of the system controller. In this manner, volume addressing can be used to access target volumes of the memory devices 630-0, 630-1, 630-2, and 630-3.

Embodiments of the present disclosure are not limited to the topology illustrated in FIG. 6. For instance, embodiments are not limited to a daisy chain topology.

CONCLUSION

The present disclosure includes methods, devices, and systems for data signal mirroring. One or more methods include receiving a particular data pattern on a number of data inputs/outputs of a memory component (e.g., via a data bus), and responsive to determining that a mirrored version of the particular data pattern is received by the memory component, configuring the number of data inputs/outputs to be mirrored.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for data signal mirroring, comprising:
   receiving a particular data pattern on a plurality of DQ pins of a memory component; and
   responsive to determining that the particular data pattern is a mirrored version of a first data pattern received by the memory component, configuring the plurality of DQ pins to be mirrored such that data signals subsequently received by the DQ pins of the memory component are mirrored, wherein the first data pattern comprises a data unit at a first data unit position and a data unit at a last data unit position;
   wherein the method includes preventing configuring of the plurality of DQ pins to be mirrored responsive to:
      receiving a data signal corresponding to a data unit at the first data unit position of the first data pattern to a DQ pin configured to receive data signals corresponding to data units at first data unit positions of data patterns sent to the memory component; and
      receiving a data signal corresponding to a data unit at the last data unit position of the first data pattern to a DQ pin configured to receive data signals corresponding to data units at last data unit positions of data patterns sent to the memory component; and wherein determining that the particular data pattern is the mirrored version of the first data pattern comprises receiving data signals corresponding to the first data pattern to the DQ pins in reverse order such that the data signal corresponding to the data unit at the first data unit position of the first data pattern is received by the DQ pin configured to receive data signals corresponding to data units at last data unit positions of data patterns sent to the memory component and such that the data signal corresponding to the data unit at the last data unit position of the first data pattern is received by the DQ pin configured to receive data signals corresponding to data units at first data unit positions of data patterns sent to the memory component.

2. The method of claim 1, wherein the memory component comprises a memory device and wherein receiving the particular data pattern comprises receiving the particular data pattern from a memory controller coupled to the memory device via a data bus.

3. The method of claim 1, wherein the first data pattern corresponds to a configuration command.

4. The method of claim 3, wherein the first data pattern corresponds to a read status command.

5. The method of claim 1, wherein the first data pattern corresponds to a reset command.

6. The method of claim 1, wherein the first data pattern corresponds to a first command that comprises more than two bits and is received by the memory component subsequent to a reset command that comprises more than two bits.

7. The method of claim 1, wherein the first data pattern corresponds to a mirrorable initialization command that comprises at least eight bits provided to eight respective DQ pins.

8. A method for data signal mirroring, comprising:
receiving an initialization command to a plurality of data inputs/outputs of a memory component, the memory component including a mirroring component, wherein a first data input/output of the plurality of data inputs/outputs is configured to receive data signals corresponding to data units at first data unit positions of data patterns received by the plurality of data inputs/outputs, and wherein a second data input/output of the plurality of data inputs/outputs is configured to receive data signals corresponding to data units at last data unit positions of data patterns received by the plurality of data inputs/outputs; and activating a data mirroring function of the mirroring component if:
the data signal corresponding to the data unit at the first data unit position of the initialization command is received by the second data input/output; and
the data signal corresponding to the data unit at the last data unit position of the initialization command is received by the first data input/out; and preventing activation of the data mirroring function of the mirroring component if:
the data signal corresponding to the data unit at the first data unit position of the initialization command is received by the first data input/output; and
the data signal corresponding to the data unit at the last data unit position of the initialization command is received by the second data input/out;

wherein the initialization command comprises a plurality of bits each received by a respective one of the plurality of data inputs/outputs of the memory component, wherein the plurality of bits comprise a particular bit pattern in a particular sequence; and wherein activating the data mirroring function of the mirroring component comprises configuring the memory component such that, for subsequent data patterns received by the plurality of inputs/outputs:
the second data input output is configured to receive data signals corresponding to data units at the first data unit position of the data patterns; and
the first data input output is configured to receive data signals corresponding to data units at the las data unit position of the data patterns.

9. A memory system, comprising:
a plurality of memory devices commonly coupled to a data bus and each including:
a plurality of data inputs/outputs including a first data input/output configured to receive data signals corresponding to bits at a most significant bit position within data patterns provided to the plurality of data inputs/outputs, and a second data input/output configured to receive data signals corresponding to bits at a least significant bit position within data patterns provided to the plurality of data inputs/outputs; and wherein the plurality of memory devices comprise circuitry configured to, responsive to a same particular data pattern received thereto via the data bus:
determine whether or not to perform a data signal mirroring function on data signals subsequently received via the data bus based on whether the bits of the particular data pattern are received:
in a first order in which a data signal corresponding to a most significant bit of the particular data pattern is received by the first data input/output and a data signal corresponding to a least significant bit of the particular data pattern is received by the second data input/output; or
in a mirrored order in which the data signal corresponding to the most significant bit of the particular data pattern is received by the second data input/output and the data signal corresponding to the least significant bit of the particular data pattern is received by the first data input/output;

wherein responsive to a determination that the bits of the particular data pattern are received in the first order, the circuitry of the respective memory device is configured to electronically mirror subsequent data signals received thereto; and wherein responsive to a determination that the bits of the particular data pattern are received in the mirrored order, the circuitry of the respective memory device is configured to not electronically mirror subsequent data signals received thereto.

10. The memory system of claim 9, wherein the plurality of inputs/outputs of each of the plurality of memory devices are coupled to the plurality of inputs/outputs of at least one other of the memory devices in a mirrored manner.

11. The memory system of claim 10, wherein at least two of the memory devices are located on opposite sides of a printed circuit board.

12. The memory system of claim 11, wherein the opposite sides correspond to a top side and a bottom side of the printed circuit board.

13. The memory system of claim 9, wherein the data bus is externally routed between the plurality of memory devices.

14. The memory system of claim 13, wherein the data bus is routed such that corresponding inputs/outputs of the number of memory devices are coupled together.

15. A memory system, comprising:
- a number of memory devices each including a number of data inputs/outputs, wherein a particular data input/output of the number of data inputs/outputs is configured to receive data signals corresponding to data units at first data unit positions of data patterns received by the number of data inputs/outputs, and wherein a different data input/output of the number of data inputs/outputs is configured to receive data signals corresponding data units at last data unit positions of data patterns received by the number of data inputs/outputs; and
- a memory controller coupled to the number of memory devices and configured to provide data signals to the number of memory devices;
- wherein at least one of the number of memory devices includes a mirroring circuitry having a data mirroring function that activates responsive to receiving a mirrored version of a first data pattern provided thereto, wherein the first data pattern comprises a data unit at a first data unit position and a data unit at a last data unit position;
- wherein the mirrored version of the first data pattern is a reverse order of a particular data pattern such that receiving the mirrored version of the first data pattern comprises receiving a data unit at a last data unit position of the particular data pattern on the particular data input/output and receiving a data unit at a first data unit position of the particular data pattern on the different data input/output; and
- wherein the mirroring circuitry is configured to not activate the data mirroring function responsive to receiving a non-mirrored version of the first data pattern such that the data unit at the last data unit position of the particular data pattern is received on the different data input/output and the data unit at the first data unit position of the particular data pattern is received on the particular data input/output.

16. The memory system of claim 15, wherein the mirroring circuitry configures the number of data inputs/outputs to be mirrored.

17. The memory system of claim 15, wherein the mirroring circuitry is configured to electronically minor data signals subsequently received by the at least one memory device.

18. The memory system of claim 15, wherein the memory system is coupled to a host via a host interface.

19. The memory system of claim 15, wherein at least two of the number of memory devices are located on opposite sides of a printed circuit board.

* * * * *